Figure 1:
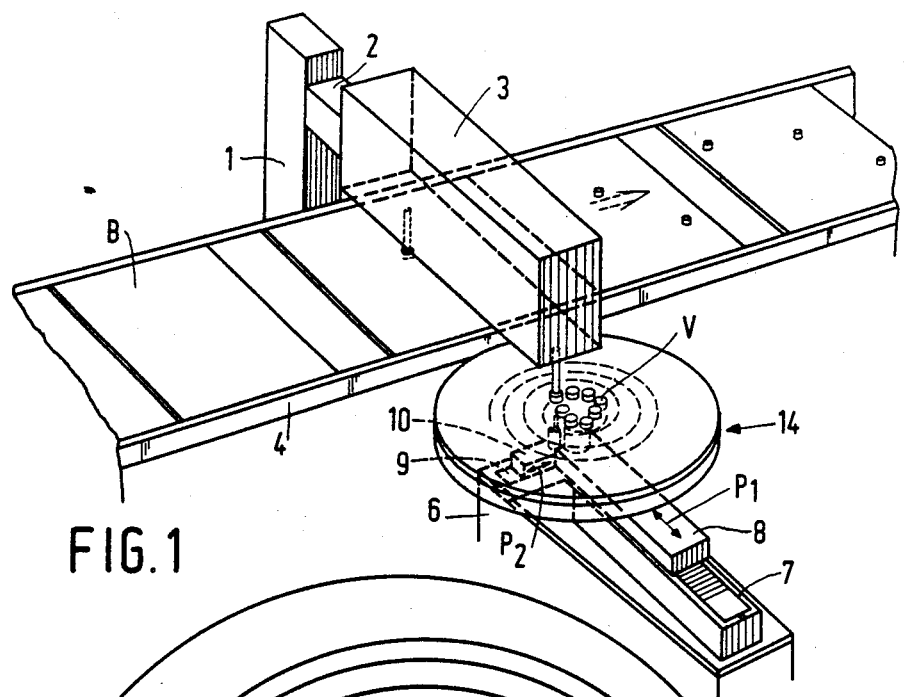

United States Patent [19]

De Lange

[11] Patent Number: 4,891,879
[45] Date of Patent: Jan. 9, 1990

[54] APPARATUS FOR PICKING UP AND PLACING COMPONENTS

[75] Inventor: Anthonie A. De Lange, Eindhoven, Netherlands

[73] Assignee: U.S. Philips Corporation, New York, N.Y.

[21] Appl. No.: 266,317

[22] Filed: Oct. 31, 1988

Related U.S. Application Data

[63] Continuation of Ser. No. 100,392, Sep. 24, 1987, abandoned.

[30] Foreign Application Priority Data

Oct. 13, 1986 [NL] Netherlands ......................... 8602563

[51] Int. Cl.$^4$ ......................... H05K 13/02; B65G 1/06
[52] U.S. Cl. ......................................... 29/822; 29/823; 29/832; 29/739; 29/809
[58] Field of Search ................. 29/739, 740, 741, 809, 29/810, 822, 823, 832, 837, 840

[56] References Cited

U.S. PATENT DOCUMENTS 4,459,743  7/1984  Watanabe et al. ................ 29/840 X
4,520,557  6/1985  Harigane et al. ................. 29/840 X
4,653,664  3/1987  Hineno et al. .................... 29/740 X

FOREIGN PATENT DOCUMENTS 641737  12/1978  Switzerland .
643793  12/1978  Switzerland .

Primary Examiner—Timothy V. Eley

[57] ABSTRACT

An apparatus for picking up, transferring and placing components by means of a transfer mechanism and a disk-shaped carrier (14), which is rotatably journalled on a carriage (8) and is provided on the lower side with a helical guide track (24) with a cam profile (25). The components (V) to be processed are arranged on the carrier (14) according to a helical line equal to the guide track (24). A supporting carriage (10) is provided with a follower element (16) and an arresting pin (18) which cooperate with the guide track (24) and the cam profile (25), respectively. By a periodical indexing movement of the supporting carriage (10), the carrier (14) is displaced stepwise in the direction of rotation and the direction of translation, as a result of which the components are taken one by one to a given pick-up position.

8 Claims, 3 Drawing Sheets

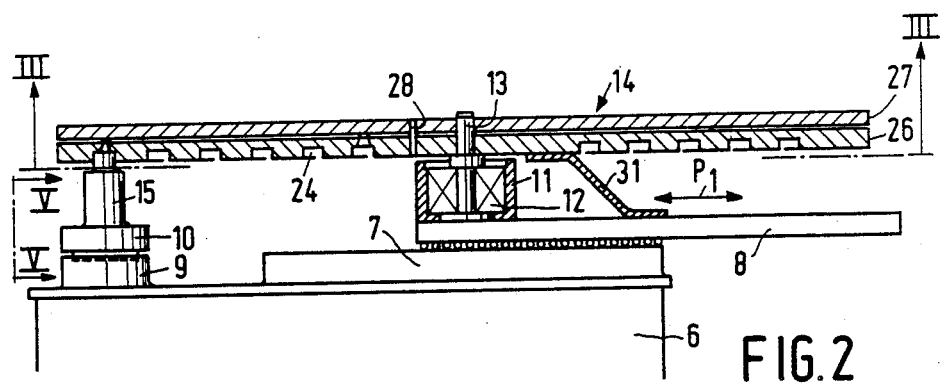
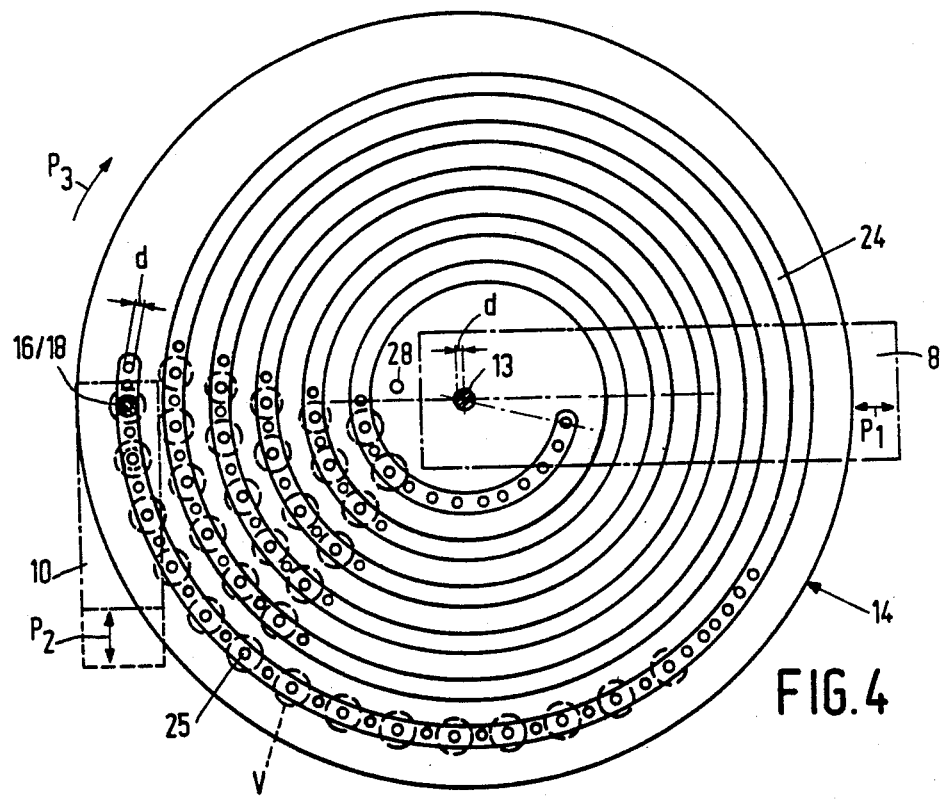

APPARATUS FOR PICKING UP AND PLACING COMPONENTS

This is a continuation of application Ser. No. 100,392, filed Sept. 24, 1987, abandoned.

The invention relates to an apparatus for picking up a give component from a supply and for transferring this component to a placement position and placing it there, this apparatus being provided with a frame and with a transfer mechanism that can be moved in a reciprocating manner between a fixed pick-up point and a fixed placement point.

Such an apparatus is known from U.S. Pat. No. 4,393,579. These apparatuses can be used in automated production lines of semi-finished products or finished products, such as printed circuit boards or the like. In this case, components are transferred one at a time from a supply to the placement position in which the component must be mounted, for example, on the printed circuit board. Transfer mechanisms for transferring components are known comprising, for example, a carriage which can be moved along a straigth line guiding with a fixed stroke and is provided with gripping means for the component, or an arm that can be swung through a given angle and is also provided with gripping means for the component. In order to ensure that the apparatus can be controlled in a simple manner, the transport track should extend between two fixed points, i.e. between the pick-up point and the placement point. However, such a mechanism requires a simple supply of the components and various possibilities have been suggested to achieve this end. For example, the vibration feeder is known, which supplies the components to the pick-up point so as to be consecutively arranged in a row; however, such a feeder is not suitable for numerous components. The components may also be supplied on a tray which is displaceable in the x and y directions; this method requires a complicated mechanical control or programming. Moreover, the displacement of the tray requires a comparatively large surface area. In the apparatus known from the afore-mentioned U.S. Patent, the components are supplied in tape or in tubular cartridges; this method is more particularly suitable for processing components in comparatively large series.

The supply of components to be developed specifically for each product provides for a substantial part of the cost price. This cost can be justified only when the series of the component to be mounted is sufficiently large. At the present-day cost price of vibration fillers, x - y tables, robot systems and the like, the critical limit lies around $10^6$ products in a year.

The invention has for its object to provide an apparatus of the kind described in the opening paragraph, which comprises a comparatively small number of mechanical means of simple construction and by means of which the components can be supplied and placed also in comparatively small series in an efficient and efficacious manner.

According to the invention, this object is mainly achieved in that at least one disk-shaped carrier is provided, which s rotatably and slidably driven with respect to the frame by means of a driving mechanism and on which the components are arranged, while the carrier is provided on the side remote from the components with a uniformly extending guide track and a cooperating guide member supported on the frame.

Due to the use of such a carrier with a uniformly extending guide track, the objects can be arranged on the carrier along this uniformly extending guide track so that the surface of this carrier can be occupied to the optimum. The guide member ensures that in the correct position of the carrier each time a component or an object is taken exactly to the pick-up point for the transfer mechanism. The position of the component to be taken up is therefore accurately determined so that the component is supplied to the transfer mechanism exactly at the pick-up point. This promotes a disturbance-free operation thereof. The apparatus according to the invention is more particularly suitable for processing components in series of $10^5$ to $10^6$ components in a year at comparatively low invention cost. The surface area covered by the disk-shaped carrier is smaller by a factor 3.5 than the surface area required for the x-y displacements of a tray of comparable capacity.

The means for driving the disk-shaped carrier can be constructed in many ways; a possibility is, for example, the use of accurately controllable stepping motors or the like. However, a preferred embodiment of the apparatus according to the invention is characterized by means for arresting the guide member in the guide track, the driving mechansim moving the guide member in a reciprocating manner and the disk-shaped carrier being slidably journalled in the frame at right angles to said reciprocating movement of the guide member. This mechanical construction affords the advantage that the driving mechanism is considerably simplified. That is, to a reciprocating movement, which further contributes to a disturbance-free operation.

It is proposed herein to construct the guide track as a preferably helical groove and to construct the guide member as a follower element engaging the groove. Such an embodiment is more particularly suitable for arresting means of simple construction, which according to the invention are constituted by a cam profile in the groove and an arresting pin cooperating with the cam profile. By means of the arresting pin, not only a transport function, but also an accurate indexing function is obtained for taking the components to the pick-up point.

In order to facilitate the arrangement of the components on the disk-shaped carrier, the latter is provided with positioning means for the component to be arranged on it. These means may be constructed as depressed parts or cavities formed in the disk surface. The cavities or depressedd parts serve as pick-up places for the components, which are positioned at a given pitch. The cavities are designed specifically for a given product and are adapted to the shapes and the dimensions of the components to be picked up.

In order to permit the loading of the carrier outside the relevant apparatus, the apparatus is characterized in that the diskshaped carrier is composed of a supporting disk and a supply disk and in that the positioning means are provided on the supply disk detachable from the supporting disk, the supporting disk and the supply disk being provided with alignment means. By these alignment means, the supply disk is placed in the correct position on the supporting disk so that the components are positioned correspondingly accurately with respect to the guide track.

The supply disk is preferably made of an inexpensive material that can be readily processed, for example a synthetic material, while the supporting disk is preferably made of metal. Due to the fact that the supply disk is detachable, the supply of component to be placed can rapidly be replenished merely by exchanging an empty supply disk for a full disk. The various supply disks can be used as transport packing. The invention further relates to a supply disk suitable for an apparatus of the kind described above.

The invention will be described more fully in the following description of the Figures of two embodiments.

Figure 3:
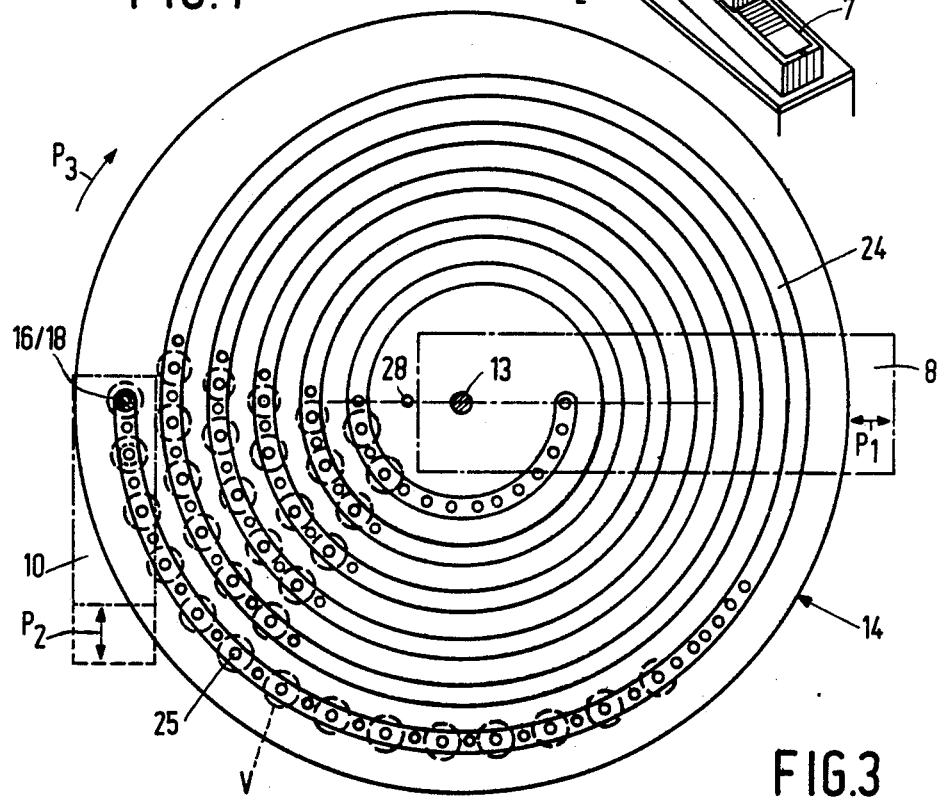
Figure 5:
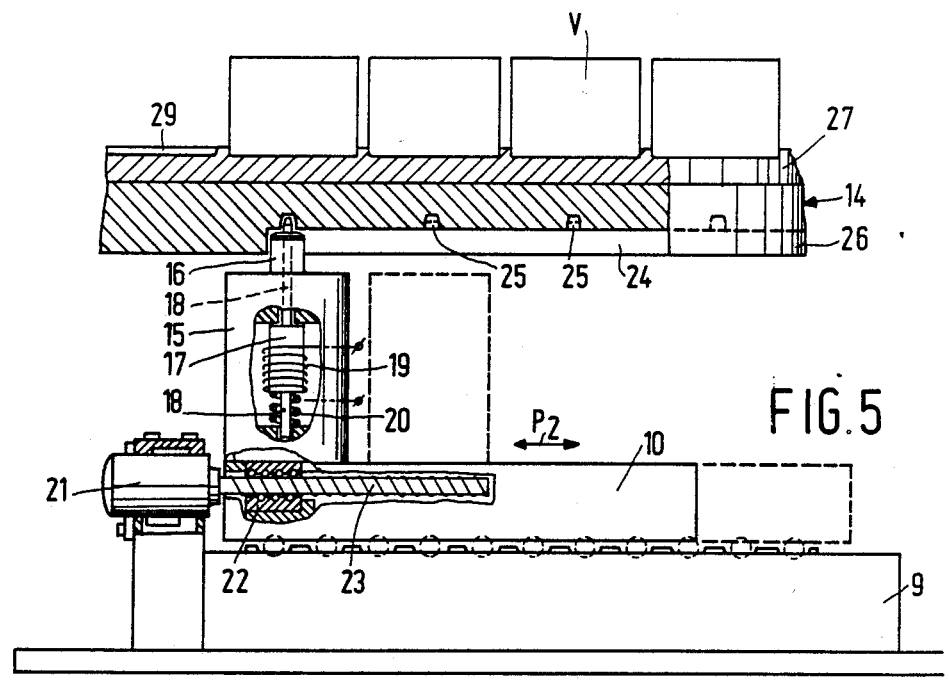
Figure 6:
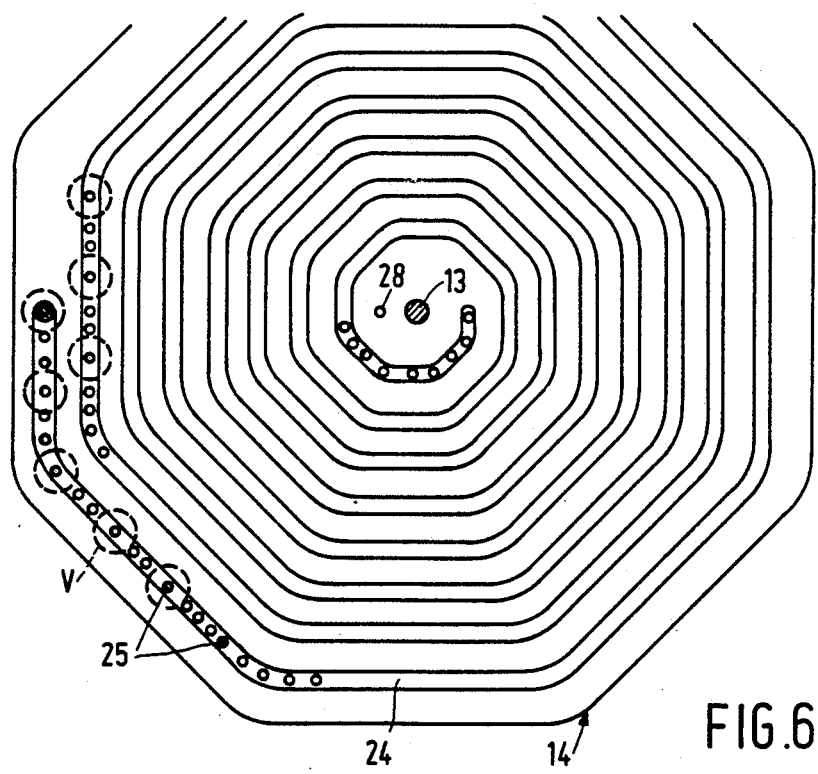

In the drawing:

FIG. 1 is a perspective plan view of the apparatus according to the invention used in a production line, FIG. 2 is a sectional view of the apparatus through the disk-shaped carrier used therein with support and drive, FIG. 3 is a bottom view of the disk-shaped carrier taken on III in FIG. 2, FIG. 4 is an elevation corresponding to FIG. 3, in which the carrier has been subjected to a given angular rotation with respect to FIG. 3, FIG. 5 shows the apparatus partly in sectional view and partly in elevation taken on the line V—V in FIG. 2, FIG. 6 is a bottom view corresponding to FIG. 3 of a second embodiment of the disk-shaped-carrier with a different guide track.

The pick-up and placement apparatus (pick and place mechanism) shown in FIG. 1 consists of a fixed frame 1 in the form of a column, to which a horizontal arm 2 is secured for supporting a transfer mechanism 3, which is provided in a manner not shown with a pick-up device for objects or components. The arm 2 or the transfer mechanism 3 extends above a transport track 4, on which products, for example printed circuit boards B are arranged, which are stepwise subjected to operations at different stations. In the apparatus shown, each time a component should be mounted at a fixed point of the printed circuit board. This point is the placement point.

The components should be taken from a supply, which can be effected one by one or groupwise. This pick-up operation takes place also at a fixed point near the end of the transfer mechanism 3 remote from the frame or column 1.

The supply control in the apparatus described above and proposed according to the invention will now be described.

The frame 1 is further provided with a cabinet-shaped support 6 provided with a first carriage track 7, on which a carriage 8 can be moved in a reciprocating manner in the direction of the arrow $P_1$.

The cabinet-shaped frame 6 further supports a second carriage track 9, on which an indexing carriage 10 is driven so as to be movable in a reciprocating manner in the direction of the arrow $P_2$. Although this is not absolutely necessary, in the embodiment shown the movement of the first carriage 8 is at right angles to that of the indexing carriage 10.

The first carriage 8 (cf. FIG. 2) supports a bearing sleeve 11, which accommodates a bearing 12. A trunnion 13 is secured in the bearing 12 and on the free upper end of this trunnion is fixed a disk-shaped carrier 14. Due to the fact that the trunnion 13 is freely rotatable with respect to the carriage 8, the carrier 14 is therefore also freely rotatable with respect to the carriage 8. Because of the reciprocating movement in the direction of the arrow $P_1$, the disk-shaped carrier is also displaceable with respect to the frame 6.

The carriage track 9 at right angles to the carriage track 7 supports, as stated, the indexing carriage 10, on which a cylindrical housing 15 is fixedly arranged. On the cylindrical housing 15 is provided a follower element 16, which is constructed as a roller or as a pin and which also serves as a guide member in a manner to be explained more fully hereinafter. The cylindrical housing 15 accommodates a soft-iron body 17, which is provided on the upper and the lower side with an axially directed arresting pin 18, which is slidably journalled in corresponding holes in the upper and the lower wall of the cylindrical housing 15. The soft-iron core 17 is surrounded by a solenoid coil 19, which can be energized in a manner not shown. A compression spring 20 is arranged below the soft-iron body 17. The upper part of the arresting pin 18 extends not only through the upper wall of the cylindrical housing 15, but also through the follower element 16 in such a manner that said upper part projects above the follower element 16.

The displacement of the indexing carriage 10 (cf. FIG. 5) on the carriage track 9 takes place by means of a reversible electric motor 21, which is secured on a part of the carriage track 9. Through a recirculating ball-bearing 22, which is secured in the indexing carriage 10, and a screw spindle 23 driven by the electric motor 21 and cooperating with the recirculating ball-bearing 22, the indexing carriage 10 can move in a reciprocating manner through a given stroke length in the direction of the arrow $P_2$. With this movement, the cylindrical housing 15, the follower element 16 and the arresting pin 18, respectively, are moved through the same stroke, for example from the position indicated by full lines in FIG. 5 to the position indicated by broken lines.

The follower element 16 cooperates with a unformly extending guide track 24 in the form of a helical groove provided on the lower side of the disk-shaped carrier (cf. also FIG. 3). A cam profile with recesses 25 is provided in the bottom of the helical groove. These recesses have a given relative distance, which is also dependent upon the centre distance between the objects or components V arranged on the disk-shaped carrier 14 along a helical line equal to the groove 24 (cf. FIGS. 3 and 6).

The disk-shaped carrier 14 is composed of a supporting disk 26 and a supply disk 27, which is detachably disposed on the upper surface of the supporting disk 26. In order to arrange the supply disk 27 in the correct position with respect to the supporting disk 26, alignment means in the form of a pin 28 are provided, which pin is fixedly arranged in the supporting disk 14, is passed into a hole of the supply disk 27 and defines the correct angular position of the supply disk 27.

It is to be preferred to provide the upper surface of the disk-shaped support 14 and the supply disk 27, respectively, on which the objects V are arranged, with depressed parts or cavities 29, in order that the objects can be arranged in the correct position on the support. These cavities 29 are arranged along the same helical line as the recesses 25 of the cam profile and due to the pin 28 they are located in register above the recesses 25 in the bottom of the groove 24.

The apparatus described above operates as follows.

After the components or objects V have been arranged elsewhere on the supply disk 27, which can be effected by hand or by a machine in a manner not shown, the supply disk 27 is arranged on the supporting disk 26 so that the pin 28 is passed through the supply disk 27. Thus, the correct position of the supply disk 27 with respect to the supporting disk 26 is guaranteed.

On the assumption that the objects are each time taken from the outer edge of the supply disk 27, the support 14 performing a stepwise rotary movement in the direction of the arrow P₃ (cf. FIG. 3), the support 14 is placed into such a position that the follower element 16 engages the beginning part of the groove 24, the retractable arresting pin 18 engaging the associated recess 25. The carrier 14 then occupies the position shown in FIG. 3 with respect to the supporting carriage 10. In this position, the first object is exactly positioned at the pick-up point so that the object can be taken up by the transfer mechanism 3, which then deposits the object at a fixed point on the printed circuit board B. Subsequently, the coil 19 is energized, which pulses the soft-iron body downwards and thus pulls the pin 18 out of the associated recess 25. The motor 21 is energized so that the supporting carriage 10 covers a given return stroke. The return stroke is equal to the pitch between the products arranged on the supply disk 27. As soon as the corresponding recess 25 has been reached, the energization of the coil 19 is eliminated so that the arresting pin 18 falls into this recess due to the effect of the compression spring 20 and the carrier 14 is arrested with respect to the follower element 16. This position is indicated in FIG. 3 by broken lines. During this return stroke of the carriage 10, an undesired rotary movement of the carrier 14 in a direction opposite to that according to arrow P₃ is avoided by internal friction. The resistance to friction can be increased by a friction element cooperating with the supporting disk 26, such as a braking block or a braking spring 31.

When the rotary movement of the driving motor 21 is reversed, the supporting carriage 10 performed an index stroke also equal to the pitch between the components on the supply disk 27. The carriage 10 is returned to the starting position together with the housing 15 and the follower element 16 whilst taking along the carrier 14 due to the arresting effect by means of the arresting pin 18. Thus, the next component V on the supply disk 27 is taken to the pick-up point. This situation is shown in FIG. 4. During the movements described, the carrier 14 will be displaced over a small distance d according to the arrow P₁ in the direction of the transfer mechanism 3 due to the cooperation of the follower element 16 with the helical groove 24 in the supporting disk 26, which is possible due to the free sliding movement of the carriage 8 with respect to the carriage track 7.

The cycle described above is repeated periodically, the follower element 16 traversing stepwise the helical groove 24 and the carrier 14 being displaced stepwise in a rotary movement according to the arrow P₃ over the pitch distance between the components V. Thus, the whole supply disk 27 is successively emptied. FIG. 1 shows the situation in which the components are taken from the inner turn of the helical track.

It will be appreciated that due to the arresting means and to the fact that the follower element 16 and the arresting pin 18 each time return to the pick-up point an efficacious and exact positioning of the components V to be taken up is guaranteed. The return and indexing stroke of the supporting carriage 10 is adjustable and can be adapted to the pitch of the components on the supply disk 27. For this purpose, the pitch between the components should be equal to or a multiple of the pitch between the recesses 25 of the cam profile in the guide track 24.

The guide track 24 shown in FIGS. 1 to 4 on the lower side of the disk-shaped carrier 14 is helical. FIG. 6 shows an alternative embodiment of this guide track, in which the guide track, in deviation from the embodiment shown above, has a polygonal shape. It will be appreciated that the guide track may be of any suitable shape, depending upon the kind and the shape of the objects to be processed.

As a matter of course, embodiments other than those described above are possible within the scope of the invention.

For example, the drive need not be effected by means of the electric motor 21 shown, but any suitable drive may be used. Furthermore, it is possible to use other guide tracks, for example a guide ridge, in which event the guide member of course should be a correspondingly designed element.

The guide member be arrested with respect to the guide track also in any suitable manner, using being made, for example, of a recess in the groove wall instead of in the groove bottom.

In a practical embodiment of an apparatus according to the invention, the carrier having a disk diameter of 320 mm contained 200 components at a relative distance of 20 mm.

By the use of two disk-shaped carriers cooperating with a single transfer mechanism and driven synchronously, multi-partite products, such as, for example, magnets, may also be assembled if a separate supply of the individual components is necessary.

What is claimed is:

1. An apparatus for picking up a given component from a supply and for transferring that component to a placement position and placing it there, said apparatus being provided with a frame and with a transfer mechanism that can be moved in a reciprocating manner between a fixed pick-up point and a fixed placement point, said apparatus having at least one disc shaped carrier on one side of which the supply of components is arranged, a driving mechanism for rotatably and slidably driving said carrier with respect to the frame, said carrier being provided on the side remote from the supply of components side with uniformly extending guide track, and a guide member supported on the frame which cooperate with said guide track, said disc-shaped carrier comprising two separate elements including a supporting disc and a supply disc.

2. An apparatus as claimed in claim 1, including arresting means for arresting said guide member in said guide track, said driving mechanism moving said guide member in a reciprocating manner and said disc-shaped carrier being slidably journalled in said frame for movement at right angles to said reciprocating movement of said guide member.

3. An apparatus as claimed in claim 2, wherein said guide track is preferably a helical groove and said guide member is a follower element engaging said groove.

4. An apparatus as claimed in claim 3, wherein said arresting means comprises a cam profile in said groove and an arresting pin cooperating with said cam profile.

5. An apparatus as claimed in claim 4, wherein said arresting pin is slidably mounted in said follower element.

6. An apparatus as claimed in claim 1, wherein said disc-shaped carrier is provided with positioning means for the components to be arranged on it.

7. An apparatus as claimed in claim 6, wherein said positioning means are cavities formed in the disc surface.

8. An apparatus as claimed in claim 7, wherein said positioning means are provided on the supply disc which is detachable from the supporting disc, said supporting disc and said supply disc being provided with alignment means.

* * * * *